US010024939B2

(12) United States Patent
Kannengiesser et al.

(10) Patent No.: US 10,024,939 B2
(45) Date of Patent: Jul. 17, 2018

(54) METHOD AND MAGNETIC RESONANCE SYSTEM TO DETERMINE THE T1 TIME OF WATER AND THE T1 TIME OF FAT

(71) Applicant: Siemens Healthcare GmbH, Erlangen (DE)

(72) Inventors: Stephan Kannengiesser, Wuppertal (DE); Marcel Dominik Nickel, Herzogenaurach (DE); Xiaodong Zhong, Lilburn, GA (US)

(73) Assignee: Siemens Healthcare GmbH, Erlangen (DE)

( * ) Notice: Subject to any disclaimer, the term of this patent is extended or adjusted under 35 U.S.C. 154(b) by 984 days.

(21) Appl. No.: 14/454,823

(22) Filed: Aug. 8, 2014

(65) Prior Publication Data
US 2015/0042334 A1    Feb. 12, 2015

(30) Foreign Application Priority Data

Aug. 8, 2013    (DE) .................. 10 2013 215 703

(51) Int. Cl.
*G01R 33/48* (2006.01)
*G01R 33/36* (2006.01)
(Continued)

(52) U.S. Cl.
CPC ..... *G01R 33/4828* (2013.01); *G01R 33/3664* (2013.01); *G01R 33/3852* (2013.01);
(Continued)

(58) Field of Classification Search
CPC ............ G01R 33/4828; G01R 33/3664; G01R 33/3852; G01R 33/50; G01R 33/543; G01R 33/565
See application file for complete search history.

(56) References Cited

U.S. PATENT DOCUMENTS 6,064,203 A    5/2000    Bottomley
6,147,492 A    11/2000    Zhang et al.
(Continued)

FOREIGN PATENT DOCUMENTS

CN    101401723 A    4/2009
JP    2006325834 A    12/2006

OTHER PUBLICATIONS

Karampinos et al. .: "$T_1$-Corrected Fat Quantification Using Chemical Shift-Based Water/Fat Separation: Application To Skeletal Muscle"; Magnetic Resonance in Medicine, vol. 66(20110 : pp. 1312-1326.
(Continued)

*Primary Examiner* — Dixomara Vargas
(74) *Attorney, Agent, or Firm* — Schiff Hardin LLP

(57) ABSTRACT

In a method and a magnetic resonance system to determine the T1 time of water and the T1 time of fat in a predetermined volume segment of an examination subject, magnetic field gradients are activated to generate multiple gradient echoes. First echoes are acquired at at least two different echo times based on RF pulses with a first flip angle. A first water magnetization and a first fat magnetization are determined for each voxel of the volume segment from the first echoes, according to the Dixon method. Second echoes are acquired at at least two different echo times based on RF pulses with a second flip angle. A second water magnetization and a second fat magnetization are determined for each voxel of the volume segment depending on the second echoes according to the Dixon method. The T1 time of water and the T1 time of fat for each voxel are determined depending on the first water magnetization of the respective voxel, the first fat magnetization of the respective voxel, the first flip angle, the second water magnetization of the (Continued)

respective voxel, the second fat magnetization of the respective voxel, and the second flip angle.

15 Claims, 3 Drawing Sheets

(51) Int. Cl.
    *G01R 33/385*     (2006.01)
    *G01R 33/50*     (2006.01)
    *G01R 33/54*     (2006.01)
    *G01R 33/565*     (2006.01)

(52) U.S. Cl.
    CPC .......... *G01R 33/50* (2013.01); *G01R 33/543* (2013.01); *G01R 33/565* (2013.01)

(56) References Cited

U.S. PATENT DOCUMENTS

| | | | |
|---|---|---|---|
| 6,459,922 B1 | 10/2002 | Zhang | |
| 6,603,989 B1* | 8/2003 | Yablonskiy | G01R 33/50 |
| | | | 600/410 |
| 7,800,368 B2* | 9/2010 | Vaughan | G01R 33/5612 |
| | | | 324/318 |
| 8,032,335 B2* | 10/2011 | Martin | G01N 24/08 |
| | | | 324/300 |
| 8,488,859 B2* | 7/2013 | Gilson | G01R 33/4828 |
| | | | 382/131 |
| 9,041,393 B2* | 5/2015 | Warntjes | G01R 33/5602 |
| | | | 324/307 |
| 9,435,871 B2* | 9/2016 | Hirai | A61B 5/055 |
| 2010/0060278 A1 | 3/2010 | Park | |
| 2012/0194193 A1 | 8/2012 | Rehwald et al. | |
| 2012/0271152 A1 | 10/2012 | Kuroda | |
| 2012/0274322 A1 | 11/2012 | Lee et al. | |
| 2012/0301007 A1 | 11/2012 | Shirai et al. | |

OTHER PUBLICATIONS

Liu et al., "Fat Quantification With IDEAL Gradient Echo Imaging: Correction of Bias From $T_1$ and Noise", in: Magnetic Resonance in Medicine, vol. 58, (2007) pp. 354-364.

* cited by examiner

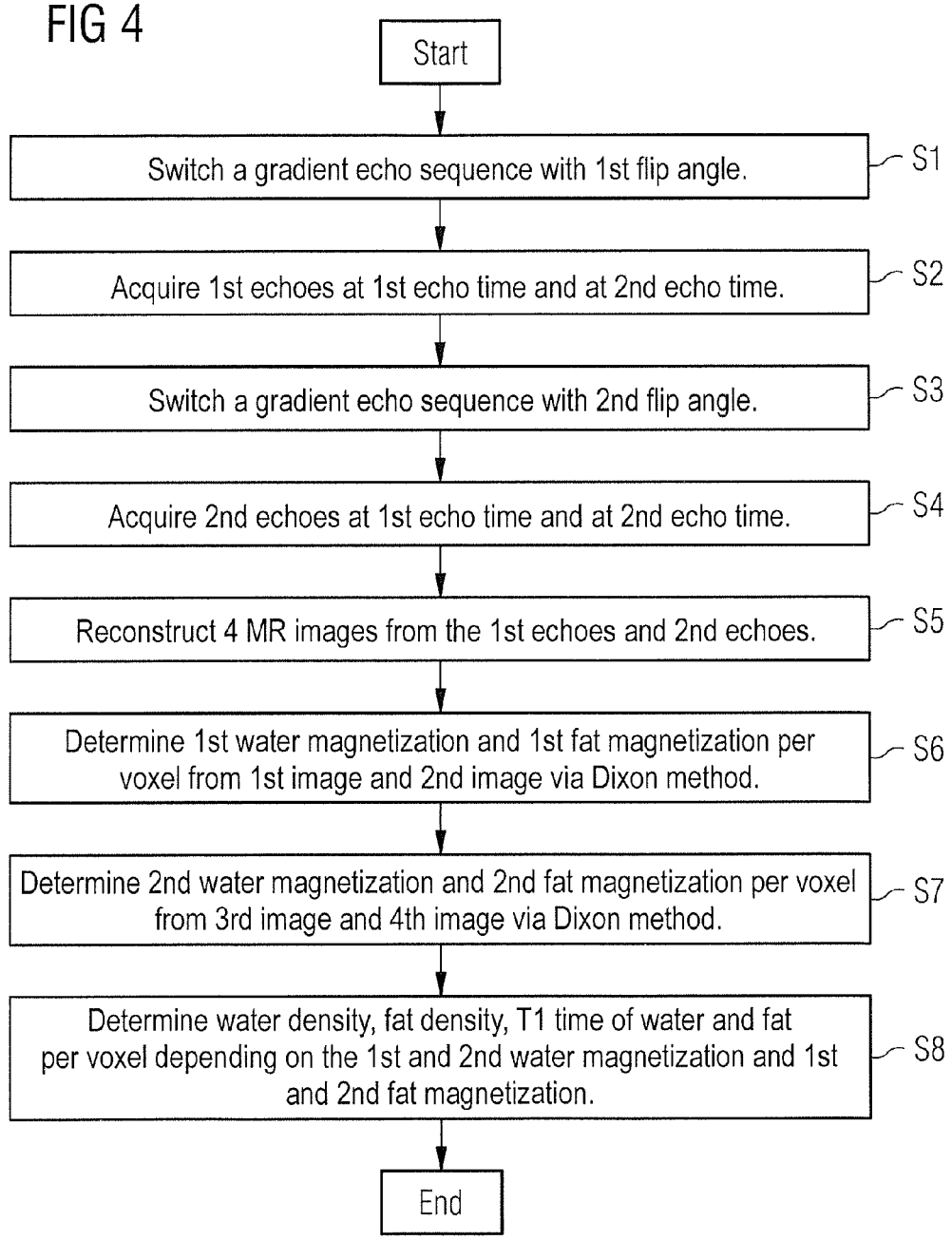

METHOD AND MAGNETIC RESONANCE SYSTEM TO DETERMINE THE T1 TIME OF WATER AND THE T1 TIME OF FAT

BACKGROUND OF THE INVENTION

Field of the Invention

The present invention concerns a method and a magnetic resonance system in order to separately determine the T1 time of water and the T1 time of fat on a voxel-by-voxel basis of a predetermined volume segment.

Description of the Prior Art

According to the prior art, it is known to produce a separate of water signals and fat signals with a technique known as the Dixon method. The Dixon method utilizes the different resonance frequencies of fat and water. Due to these different resonance frequencies, the phase relationship between the water magnetization and the fat magnetization is dependent on the echo time (time interval between the RF excitation pulse and the acquired echo). For example, if a first echo time is now chosen so that the water magnetization and the fat magnetization are in phase, and a second echo time is chosen so that the water magnetization and the fat magnetization have a phase relationship of 180° (opposed phase), the following Equation (1) then applies for the magnetization $M_1$ acquired at the first echo time and the following Equation (2) applies for the magnetization $M_2$ acquired at the second echo time.

$$M_1 = W + F \quad (1)$$

$$M_2 = W - F \quad (2)$$

wherein W is the water magnetization (i.e. the magnetization caused by the water molecules) and F is the fat magnetization (i.e. the magnetization caused by the fat molecules). Equations (1) and (2) can be converted into the following Equations (3) and (4) so that ultimately the water magnetization W and the fat magnetization F are determined.

$$W = (M_1 + M_2)/2 \quad (3)$$

$$F = (M_1 - M_2)/2 \quad (4)$$

According to the Dixon method, echoes can also be acquired at more than two different echo times in order to determine the water magnetization and the fat magnetization separately at these more than two magnetizations. Given the acquisition of more than two echoes, in addition to the two magnetizations additional effects (such as the transversal T2* relaxation) are also often considered and/or determined. In summary, the Dixon method determines the water magnetization and the fat magnetization (and possibly the transversal relaxation times T2*) per voxel based on at least two magnetizations which are determined or known for each voxel at different echo times, using the phase relationships of these magnetizations relative to one another (which phase relationships are known from the echo times).

However, the Dixon method also has weak points. For example, the Dixon method is susceptible to $T_1$ relaxation effects. According to the prior art, this weak point is often counted via the use of RF excitation pulses with small flip angles (<10°), which must, however, be paid for in turn with a low signal-to-noise ratio.

SUMMARY OF THE INVENTION

An object of the present invention is to determine the T1 time of water and the T1 time of fat in a predetermined volume segment.

The present invention concerns a method to determine a T1 time of water and a T1 time of fat in a predetermined volume segment of an examination subject using a magnetic resonance system. The T1 time of water or fat is the longitudinal relaxation time of water or fat. The method includes the following steps.

Magnetic field gradients are switched (activated) at different echo times in order to generate gradient echoes. In other words, a gradient echo sequence is used in order to acquire MR data.

At two or more different echo times, first echoes are acquired with the aid of RF pulses which have a first flip angle. In other words, gradient echo sequences are acquired at different echo times after a respective RF excitation pulse with the first flip angle.

Depending on these first echoes, a first water magnetization and a first fat magnetization are determined voxel-by-voxel of the volume segment with the use of the Dixon method.

Second echoes are similarly acquired at two or more different echo times with the use of RF pulses that have a second flip angle.

Based on these second echoes, a second water magnetization and a first fat magnetization are determined for each voxel of the volume segment with the use of the Dixon method.

Depending on the (first or second) water magnetizations of the respective voxel that belong to the respective flip angle, and on the (first or second) fat magnetizations of the respective voxel that belong to the respective flip angle, as well as on the respective (first and second) flip angles, the T1 time of water and the T1 time of fat are determined or calculated for each voxel.

According to the invention, it is possible to repeat the steps described above for additional flip angles, so additional water magnetizations and fat magnetizations are obtained for each voxel of the volume segment for the respective flip angles that are used.

The method according to the invention accordingly acquires gradient echoes at different echo times for multiple flip angles. Larger flip angles (>10°) can also be used. A respective magnetization per voxel is then known for the different echo times as an intermediate result. If the method according to the invention operates with n different echo times and m different flip angles, n*m magnetizations for each voxel are accordingly known.

With the Dixon method, the water magnetization and fat magnetization for the respective voxel are then determined for each flip angle, depending on the n magnetizations known for the respective flip angle, such that the number of water magnetizations and fat magnetizations that are determined for each voxel corresponds to the number of flip angles.

In particular, if more than four echo times are used to acquire the first and second echoes (or additional echoes), the same time interval (for example 1 ms, in practice) can be present between two of these echo times that are temporally adjacent. These echo times can then be designated as equidistant echo times. The shortest of these echo times thereby advantageously corresponds to the shortest echo time that is to be realized by the magnetic resonance system that is used.

According to another embodiment of the invention, the echo times are chosen such that a homogeneous distribution over the unit circle results with regard to the phase difference between the water signal and the fat signal. For this purpose, the phase difference φ between the water signal and the fat signal is:

$$\varphi = f * 360° / n \quad (5)$$

wherein f is a natural number and n is the number of different echo times.

Given three different echo times, the phase difference or, respectively, the phase shift can amount to 120° (240°) at the first echo time, 240° (480°) at the second echo time and 360° (720°) at the third echo time.

According to a simplified embodiment, the method according to the invention includes the following steps.

Multiple RF excitation pulses are activated that respectively have the first flip angle.

A gradient echo is read out at a first echo time after one of the RF excitation pulses with the first flip angle.

A gradient echo is read out at a second echo time after one of the RF excitation pulses with the first flip angle.

Multiple RF excitation pulses are activated that respectively have the second flip angle.

A gradient echo is read out at a first echo time after one of the RF excitation pulses with the second flip angle.

A gradient echo is read out at a second echo time after one of the RF excitation pulses with the second flip angle.

The second flip angle is different than the first flip angle, and the first echo time differs from the second echo time.

Naturally, additional flip angles and additional echo times can be used.

According to the invention, it is possible that, after one of the RF excitation pulses, only one gradient echo is acquired or read out before the next RF excitation pulse is switched. However, according to the invention it is also possible that multiple gradient echo sequences are read out after one or the same RF excitation pulse, before the next RF excitation pulse is switched.

According to an embodiment according to the invention, the method can additionally include the following steps.

A gradient echo is read out at an additional echo time after one of the RF pulses with the first flip angle.

A gradient echo is read out at the additional echo time after one of the RF pulses with the second flip angle.

The T2* time for each voxel is determined, depending on the gradient echoes that are acquired at the additional echo time.

This embodiment can also be implemented with more than two flip angles. The additional echo time differs from the echo times (for example from the first and second echo time) which are (primarily) used to determine the T1 time of water and the T1 time of fat.

According to the prior art, given use of more than two echoes the Dixon method also allows a T2* time (which is assumed to be the same for water and fat) to be determined in addition to the T1 time of water and the T1 time of fat. Given use of more than three echoes, the respective T2* times can be determined independently for water and fat. This in particular also leads to an improvement of the precision of the simultaneously determined T1 time of water and T1 time of fat.

In a further embodiment according to the invention, the method includes the following steps.

A first MR image of the volume segment is generated from the gradient echoes that are acquired the first echo time after the RF pulses with the first flip angle.

A second MR image of the volume segment is reconstructed from the gradient echoes that are acquired the second echo time after the RF pulses with the first flip angle.

A third MR image of the volume segment is reconstructed from the gradient echoes that are acquired the first echo time after the RF pulses with the second flip angle.

A fourth MR image of the volume segment is reconstructed from the gradient echoes that are acquired the second echo time after the RF pulses with the second flip angle.

The first, second, third and fourth images are brought into registration.

Via the Dixon method, the first water magnetization and the first fat magnetization are determined for each voxel, from the data of the corresponding voxels of the first and second images.

Via the Dixon method, the second water magnetization and the second fat magnetization are determined for each voxel, from the data of the corresponding voxels of the third and fourth images.

This embodiment shows that the Dixon method is based on the pixel values of the reconstructed images that correspond to the magnetization determined for each voxel. It is insignificant which k-space segments are acquired for the individual images, as long as the conditions described in the preceding with regard to the echo times and the flip angles are maintained. In other words, for acquisition of the gradient echoes for one of the images, other k-space segments are scanned than for acquisition of the gradient echoes for another of the images.

The water magnetization $M_W$ that is determined for each voxel depends on the longitudinal relaxation time $T_{1,W}$ for water in this voxel, on the repetition time $T_R$, on the water density $\rho_W$ in this voxel, and on the flip angle α, for example according to the following Equation (6).

$$M_W = \frac{1 - e^{\frac{-T_R}{T_{1,W}}}}{1 - \cos(\alpha) e^{\frac{-T_R}{T_{1,W}}}} \sin(\alpha) \rho_W \quad (6)$$

The fat magnetization $M_F$ that is determined for each voxel similarly depends on $T_{1,F}$ in this voxel, on the repetition time $T_R$, on the fat density $\rho_F$ in this voxel, and on the flip angle α, for example according to the following Equation (7).

$$M_F = \frac{1 - e^{\frac{-T_R}{T_{1,F}}}}{1 - \cos(\alpha) e^{\frac{-T_R}{T_{1,F}}}} \sin(\alpha) \rho_F \quad (7)$$

Equations (6) and (7) assume that the water magnetization $M_W$ and the fat magnetization $M_F$ are what are of the type known as steady state signals. A steady state signal is a signal that is measured given a magnetization in dynamic equilibrium.

If the water magnetization and the fat magnetization for at least two measurements are present with different flip angles but with the same repetition time $T_R$, not only the T1 time $T_{1,W}$ of water and T1 time $T_{1,F}$ of fat but also the water density $\rho_W$ and the fat density $\rho_F$ can be determined using Equations (6) and (7).

The aforementioned density is the proton density (most often measured in molar units). Since the T1 time of water and fat are known, the water density and fat density are respectively a water density or fat density free of the T1 time (meaning that the determined water density or fat density is purged of T1 effects). Since the measurement of the echoes depends on many properties (for example the sensitivity of the reception antennas), the water density or fat density is measured in the same unit (which is not specified, however).

For this reason, the determined water density and fat density are, however, suitable to determine the water portion WA and the fat portion FA in the corresponding voxel according to the following Equations (8) and (9).

$$WA = \frac{\rho_W}{\rho_W + \rho_F} \quad (8)$$

$$FA = \frac{\rho_F}{\rho_W + \rho_F} \quad (9)$$

In these equations, in which $\rho_W$ corresponds to the water density and $\rho_F$ corresponds to the fat density, the unit of density (which is the same but not specified for the water density and fat density) advantageously cancels out, and the proportion of water or, respectively, fat in the tissue is determined.

To determine the T1 time of water and the T1 time of fat, and possibly the water density and the fat density, in particular the water portions and fat portions of the magnetization that are determined at the different flip angles are fitted (adapted) separately to the respective signal models in Equation (6) and Equation (7). For this purpose, an optimization function is normally created which describes an agreement of the data with the signal model, and which depends on the respective relaxation time (T1 time) and the respective proton density (water density or fat density). Among other things, Lp norms or chi squares between data and signal model lend themselves to these. These expressions can be optimized with diverse numerical algorithms, wherein in many cases the Marquardt-Levenberg algorithm is used.

One example of a numerically efficient technique is to optimize the expression $\Sigma_i (M/\tan(\alpha_i)*y+x-M/\sin(\alpha_i))^2$ for the variables x and y, wherein M stands for the magnetization and the index i summates across all measured flip angles $\alpha_i$. Based on Equation (6) and Equation (7), the determined variables x and y can be expressed as follows: $x=(1-\exp(-TR/T1))\rho$ and $y=\exp(-TR/T1)$). With a known repetition time TR, from this expression, T1 (the T1 time) and $\rho$ (water density or fat density) can be calculated. Given separate implementation of the method for water and fat, the T1 time $T_{1,W}$ for water, the T1 time $T_{1,F}$ for fat, the water density $\rho_W$ and the fat density $\rho_F$ can then respectively be determined.

To improve the method according to the invention, the actual flip angle can be determined and be used to determine the T1 time of water and the T1 time of fat, instead of the flip angle set to generate the RF excitation pulse. For this purpose, the actual flip angle can be determined with a special measurement sequence for each voxel, based on the same desired flip angle $\beta_{nom}$ which is set for the RF excitation pulses of this measurement sequence, such that essentially a flip angle map is created for the predetermined volume segment. Using the following Equation (10)

$$\alpha(x) = \alpha_{nom}\frac{\beta(x)}{\beta_{nom}}, \quad (10)$$

for each voxel x the actual flip angle $\alpha(x)$ can then be calculated depending on the flip angle $\alpha_{nom}$ set for the current RF excitation pulse, depending on the desired flip angle $\beta_{nom}$ set for the special measurement sequence, and depending on the flip angle $\beta(x)$ determined by the measurement sequence for the corresponding voxel.

By the use of the actual flip angle instead of the set (for example first or second) flip angle, the determination of the T1 time of water and the T1 time of fat can take place for each voxel, and possibly the determination of the density for each voxel for fat and water can take place more precisely.

The present invention combines the Dixon method with a method that is known to determine the T1 time in order to determine the T1 time of water and the T1 time of fat separately for each voxel. Through the present invention, the sensitivity of the Dixon method to B1 inhomogeneities can be counteracted so that the determined T1 time of water and fat is effectively not influenced by present B1 inhomogeneities.

Moreover, with the present invention the density can also be determined separately for each voxel for water and fat.

To determine the T1 time of water and the T1 time of fat, echoes must be acquired at at least two different echo times, respectively for at least two different flip angles. If the T2* time should additionally be taken into account or determined, echoes must respectively be determined for the different flip angles at at least three different echo times.

Within the scope of the present invention, a magnetic resonance system is also provided to determine a T1 time of water and a T1 time of fat. The magnetic resonance system includes a basic field magnet, a gradient field system, one or more RF antennas, and a control device to control the gradient field system and the RF antenna(s), to receive the measurement signals that are acquired by the RF antenna(s), and to evaluate the measurement signals and to create MR data. The magnetic resonance system is designed such that control device causes multiple bipolar magnetic field gradients to be activated (Gx) in order to generate gradient echoes, and causes RF pulses to be radiated with a first flip angle and with a second flip angle that differs from the first flip angle. First echoes are acquired at at least two different echo times ($T_{E1}$-$T_{E3}$) based on the RF pulses with the first flip angle in order to determine a first water magnetization and a first fat magnetization for each voxel of the volume segment depending on the first echoes, according to the Dixon method. The control device furthermore causes second echoes to be acquired at at least two different echo times ($T_{E1}$-$T_{E3}$) based on the RF pulses with the second flip angle in order to determine a second water magnetization and a second fat magnetization for each voxel of the volume segment depending on the second echoes, according to the Dixon method. The T1 time of water and the T1 time of fat of the respective voxel are determined depending on the first water magnetization of the respective voxel, the first fat magnetization of the respective voxel, the first flip angle, the second water magnetization of the respective voxel, the second fat magnetization of the respective voxel, and the second flip angle.

The advantages of the magnetic resonance system according to the invention essentially correspond to the advantages of the method according to the invention that have been described in detail above.

Furthermore, the present invention encompasses a non-transitory, computer-readable storage medium encoded with programming instructions. The storage medium can be loaded into a memory of a programmable control device or a computer of a magnetic resonance system. All or various embodiments of the method according to the invention that are described in the preceding can be implemented when the programming instructions are executed in the control device. The programming instructions may possibly require program item (for example libraries and auxiliary functions) in order to realize the corresponding embodiments of the method. The programming instructions can be source code (C++, for example) that still needs to be compiled and linked or that must only be interpreted, or an executable software code that has only to be loaded into the corresponding computer or control device for execution.

The electronically readable data medium can be a DVD, a magnetic tape or a USB stick, for example on which the electronically readable control information is stored.

The present invention is in particular suitable for reconstruction of MR images in which the water signal and the fat signal can be differentiated very precisely for each voxel. Naturally, however, the present invention is not limited to this preferred field of application, since—for example—the T1 time of water and fat as well as the water density and the fat density for each voxel can also be determined very precisely with the present invention.

BRIEF DESCRIPTION OF THE DRAWINGS

FIG. 4 is a flow chart of an embodiment of a method according to the invention for the determination of the T1 time of water and the T1 time of fat.

DESCRIPTION OF THE PREFERRED EMBODIMENTS

Figure 1:
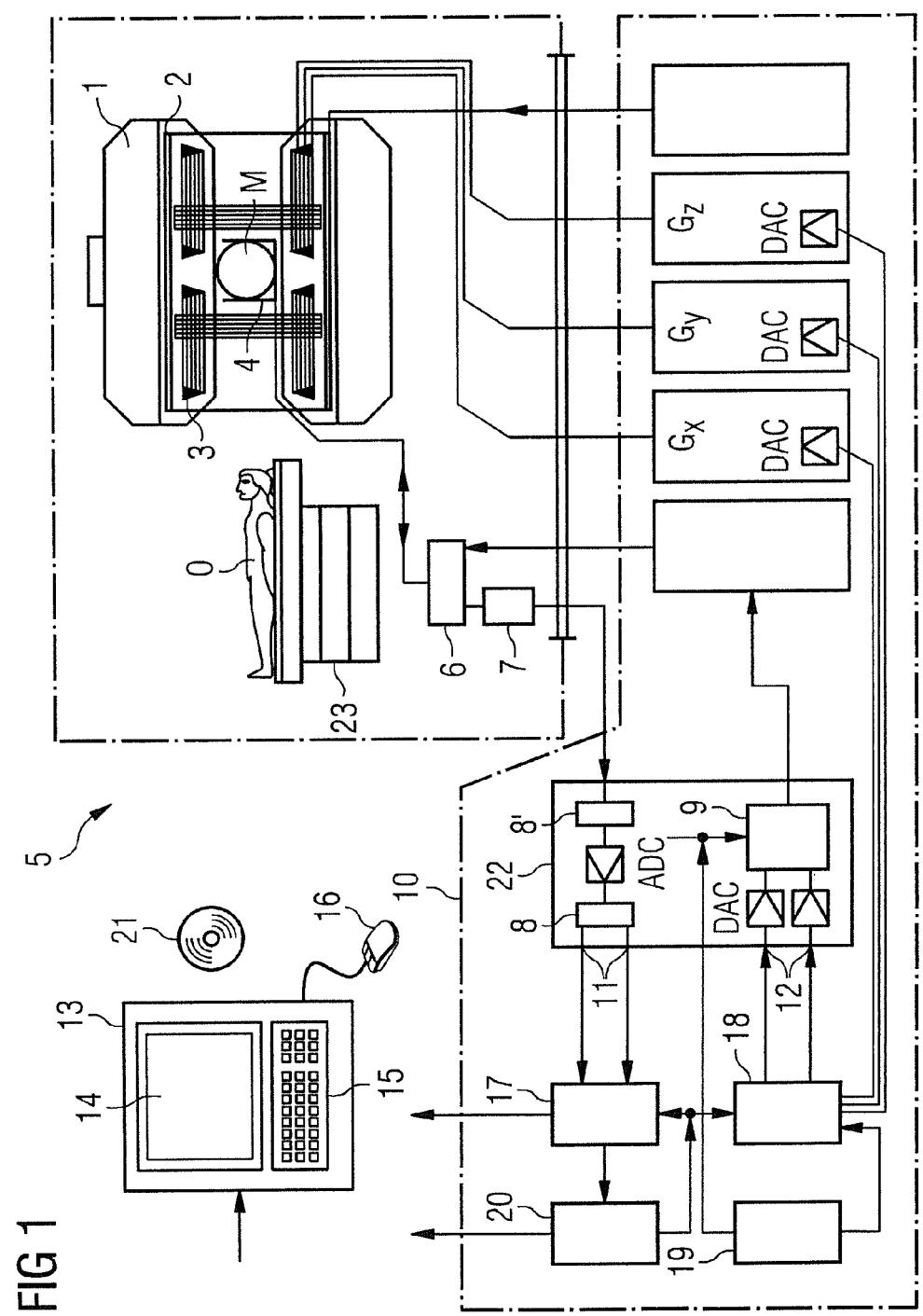
FIG. 1 illustrates a magnetic resonance system according to the invention.

FIG. 1 is a schematic depiction of a magnetic resonance (MR) system 5 (a magnetic resonance imaging or magnetic resonance tomography apparatus). A basic field magnet 1 thereby generates a temporally constant, strong magnetic field for polarization or alignment of the nuclear spins in a volume segment of a subject O, for example of a part of a human body that is to be examined, which body (lying on a table 23) is examined in the magnetic resonance system 5. The high homogeneity of the basic magnetic field that is required for the magnetic resonance measurement is defined in a typically spherical measurement volume M into which the parts of the human body that are to be examined are introduced. Shim plates made of ferromagnetic material are attached at suitable points to support the homogeneity requirements, and in particular to eliminate temporally invariable influences. Temporally variable influences are eliminated by shim coils 2.

A cylindrical gradient coil system 3 that has three sub-windings is situated in the basic field magnet 1. Each sub-winding is supplied with current by an amplifier to generate a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier has a digital/analog converter that is activated by a sequence controller 18 for accurately-timed generation of gradient pulses.

Situated within the gradient field system 3 are one (or more) radio-frequency antennas 4 that convert the radio-frequency pulses emitted by a radio-frequency power amplifier into an alternating magnetic field for excitation of the nuclei and alignment of the nuclear spins of the subject O to be examined, or of the region of the subject O that is to be examined. Each radio-frequency antenna 4 has one or more RF transmission coils and one or more RF reception coils in the form of an annular (advantageously linear or matrix-like) arrangement of component coils. The alternating field emanating from the processing nuclear spins—normally the nuclear spin echo signals caused by a pulse sequence made up of one or more radio-frequency pulses and one or more gradient pulses—is also converted by the RF reception coils of the respective radio-frequency antenna 4 into a voltage (measurement signal), which is supplied via an amplifier 7 to a radio-frequency reception channel 8 of a radio-frequency system 22. The radio-frequency system 22 (which is part of a control device 10 of the magnetic resonance system 5) furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system via respective inputs 12, and from the digital/analog converter to the transmission channel 9. In the transmission channel 9, the pulse sequences are modulated on a radio-frequency carrier signal whose base frequency corresponds to center frequency.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M and scans resulting echo signals via the RF reception coils. The correspondingly acquired nuclear magnetic resonance signals are phase-sensitively demodulated on an intermediate frequency in a reception channel 8' (first demodulator) of the radio-frequency system 22, digitized in an analog/digital converter (ADC) and output via the outputs 11. This signal is further demodulated to a frequency of 0. The demodulation to a frequency of 0 and the separation into real part and imaginary part occurs in a second demodulator 8 after the digitization in the digital domain. An MR image or, respectively, three-dimensional image data set is reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 controls the accurately-timed switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs (which are stored on a DVD 21, for example) to generate an MR image and the presentation of the generated MR image take place via a terminal 13 that comprises a keyboard 15, a mouse 16 and a monitor 14.

Figure 2:
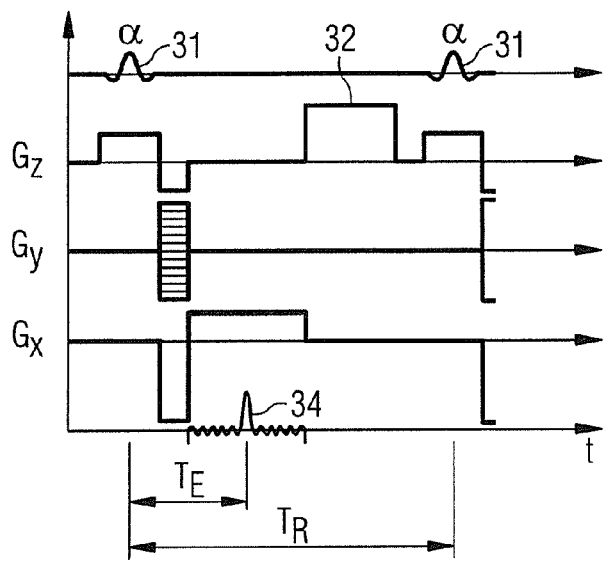
FIG. 2 shows a sequence according to the invention for the determination of the T1 time of water and the T1 time of fat.

A gradient echo sequence according to the invention is depicted in FIG. 2. At the beginning, an RF excitation pulse 31 with a flip angle α is switched, while at the same time a slice selection gradient Gz is activated. The phase transition created at the excitation is canceled via the change of the polarity of the slice selection gradient Gz after the RF excitation pulse 31. At the same time, the spins are expanded by switching the frequency coding gradient Gx (this part of the frequency coding gradient Gx is also known as a rewinder 33). The phase coding gradient Gy that is likewise switched after the RF excitation pulse 31 serves for spatial coding. By changing the polarity of the frequency coding gradient Gx, the previously expanded spins are brought into phase again or, respectively, are rephased, which leads to the gradient echo 34. Measurement data are acquired while the frequency coding gradient Gx (in FIG. 2) has its positive polarity in order to read out a k-space line in the x-direction.

After the frequency coding gradient Gx, thus after the acquisition of the measurement data, a spoiler gradient 32 is switched in order to eliminate the transversal magnetization. After this spoiler gradient 32, the next RF excitation pulse 31 is switched, whereby an additional period of the gradient echo sequence begins.

The echo time TE is measured by the RF excitation pulse 31 up to the gradient echo 34, which occurs in the chronological middle of the positive portion (according to FIG. 2) of the frequency coding gradient Gx. The repetition time TR determines the time interval between two temporally adjacent RF excitation pulses 31.

Figure 3:
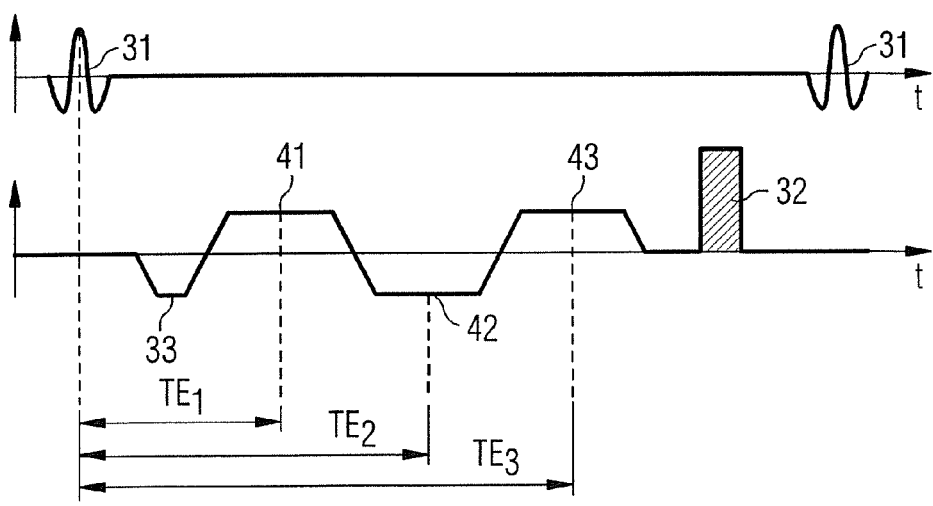
FIG. 3 shows a further sequence according to the invention for the determination of the T1 time of water and the T1 time of fat.

An additional gradient echo sequence is depicted in FIG. 3. For simplification, in FIG. 3 only the frequency coding gradient and the spoiler gradient are shown on one axis. It is apparent that, in contrast to FIG. 2, three gradient echoes 41-43 are acquired based on the same RF excitation pulse 31 (far left in FIG. 3). For this, similar to as in FIG. 2 what is known as the rewinder 33 is switched after the RF excitation pulse 31, before the frequency coding gradient changes its polarity, in order to acquire the measurement data of the first gradient echo 41. After a further change of the polarity of the frequency coding gradient, the measurement data of the second gradient echo 42 are acquired, and finally after an additional change of the polarity of the frequency coding gradient the measurement data of the third gradient echo 43 are acquired.

The rewinder is required only at the beginning or directly after the RF excitation pulse 31 since, after the respective change of the polarity, the second half of the frequency coding gradient effectively plays the role of this rewinder for the next gradient echo to be acquired.

While only one gradient echo is accordingly acquired with the gradient echo sequence depicted in FIG. 2 after an RF excitation pulse 31, three gradient echoes 41-43 with the echo times $T_{E1}$-$T_{E3}$ are acquired given the gradient echo sequence depicted in FIG. 3. In order to acquire the same measurement data with the gradient echo sequence shown in FIG. 2 as given the gradient echo sequence shown in FIG. 3, the gradient echo sequence shown in FIG. 2 would accordingly need to be implemented three times, wherein the frequency coding gradient Gx would need to be set such that the gradient echo at the echo time $T_{E1}$ is generated and acquired once, the gradient echo at the echo time $T_{E2}$ is generated and acquired once, and the gradient echo at the echo time $T_{E23}$ is generated and acquired once.

It is noted that with a slice selection gradient Gz (see FIG. 2) or an additional phase coding gradient Gz (not shown in Figures) can be worked with.

A flow chart of an embodiment of the method according to the invention is shown in FIG. 4.

In a first step S1, a gradient echo sequence with a first flip angle is switched, which means that the switched RF excitation pulses 31 have the first flip angle. In a second step S2, first echoes (more precisely gradient echoes) are acquired at a first echo time and a second echo time differing from said first echo time. Similarly, in a third step S3 a gradient echo sequence is switched with a second flip angle that differs from the first flip angle, which means that the switched RF excitation pulses 31 have the second flip angle. In a fourth step S4, second echoes are acquired at the first echo time and at the second echo time.

In a fifth step S5, four MR images are reconstructed from the first echoes and the second echoes. More precisely, the first MR image is reconstructed from the echoes that are acquired at the first echo time based on the RF excitation pulses 31 with the first flip angle, and the second MR image is reconstructed from the echoes that are acquired at the second echo time based on the RF excitation pulses 31 with the first flip angle. Similarly, the third MR image is reconstructed from the echoes that are acquired at the first echo time based on the RF excitation pulses 31 with the second flip angle, and the fourth MR image is reconstructed from the echoes that are acquired at the second echo time based on the RF excitation pulses 31 with the second flip angle.

In Step S6 a first water magnetization and a first fat magnetization can be determined for each voxel from the first image and the second image with the use of the Dixon method. In Step S7, a second water magnetization and a second fat magnetization are similarly determined in Step S7 from the third image and the fourth image by means of the Dixon method.

For example, using Equations (6) and (7) the water density, the fat density and the T1 time of water and fat can be determined separately for each voxel of the volume segment in step S8, depending on the first and second water magnetization and the first and second fat magnetization.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to determine the T1 time of water and the T1 time of fat in a predetermined volume segment of an examination subject by operation of a magnetic resonance (MR) system, comprising:

operating the MR system to activate magnetic field gradients to generate gradient echoes at multiple echo times in the examination subject;

operating the magnetic system to acquire first echoes at at least two different echo times based on RF pulses with a first flip angle;

in a computer, reconstructing an image of the volume segment comprising voxels, from said first echoes;

in a computer, determining a first water magnetization and a first fat magnetization for each voxel of the volume segment in the image reconstructed from the first echoes, depending on the first echoes according to the Dixon method;

operating the MR system to acquire second echoes at at least two different echo times based on RF pulses with a second flip angle;

in said computer, reconstructing an image of the volume segment, also comprising voxels, from said second echoes;

in said computer, determining a second water magnetization and a second fat magnetization for each voxel of the volume segment in the image reconstructed from the second echoes, depending on the second echoes according to the Dixon method;

in said computer, bringing said image reconstructed from said first echoes and said image reconstructed from said second echoes into registration in order to obtain a registered image also comprised of voxels, with each voxel in the registered image being a registration of a voxel of the image reconstructed from the first echoes and a corresponding voxel in the image reconstructed from the second echoes;

in said computer, determining the T1 time of water and the T1 time of fat for each voxel in the registered image, depending on the first water magnetization of the respective voxel in the registered image, the first fat magnetization of the respective voxel in the registered image, the first flip angle, the second water magnetization of the respective voxel in the registered image, the second fat magnetization of the respective voxel in the registered image, and the second flip angle, thereby obtaining a flip-angle dependent T1 time of water and a flip angle-dependent T1 time of fat; and at a display screen in communication with said computer, presenting a visual designation of said flip angle-dependent T1 time of water and said flip angle-dependent T1 time of fat.

2. A method as claimed in claim 1, comprising operating the MR system with the same time interval that exists between the at least two different echo times with which the first echoes and the second echoes are respectively acquired.

3. A method as claimed in claim 2, comprising operating the MR system with a time interval chosen to cause a phase difference φ between the water signal and the fat signal during the time interval to be $$\varphi = f*360°/n$$

wherein f corresponds to a natural number and n corresponds to the number of the at least two different echo times ($T_{E1}$-$T_{E3}$).

4. A method as claimed in claim 1, comprising:
operating the magnetic system to activate multiple RF excitation pulses with the first flip angle;
operating the magnetic system to read out an echo at a first echo time after one of the RF pulses with the first flip angle;
operating the magnetic system to read out an echo at a second echo time after one of the RF pulses with the first flip angle;
operating the magnetic system to activate multiple RF pulses with a second flip angle;
operating the magnetic system to read out an echo at the first echo time after one of the RF pulses with the second flip angle;
operating the magnetic system to read out an echo at the second echo time after one of the RF pulses with the second flip angle; and
wherein the second flip angle is different than the first flip angle, and wherein the first echo time differs from the second echo time.

5. A method as claimed in claim 4, comprising:
operating the magnetic system to acquire multiple echoes after a same one of the RF pulses, before a next of the RF pulses is radiated.

6. A method as claimed in claim 4, comprising:
operating the magnetic system to read out an echo at an additional echo time after one of the RF pulses with the first flip angle;
operating the magnetic system to read out an echo at the additional echo time after one of the RF pulses with the second flip angle;
wherein the additional echo time is different than the first echo time and the second echo time; and
wherein the T2* time for each voxel is determined depending on echoes acquired at the additional echo time.

7. A method as claimed in claim 4, comprising:
in said computer, reconstructing a first image of the volume segment from the echoes acquired at the first echo time after the RF pulses with the first flip angle;
in said computer, reconstructing a second image of the volume segment from the echoes acquired at the second echo time after the RE pulses with the first flip angle;
in said computer, reconstructing a third image of the volume segment from the echoes acquired at the first echo time after the RF pulses with the second flip angle;
in said computer, reconstructing a fourth image of the volume segment from the echoes acquired at the second echo time after the RE pulses with the second flip angle;
in said computer, bringing the first image, second image, third image and fourth image into registration with one another;
in said computer, determining the first water magnetization and the first fat magnetization for each voxel according the Dixon method, depending on data of the voxel of the first image and of the second image; and
in said computer, determining the second water magnetization and the second fat magnetization for each voxel according the Dixon method, depending on data of the voxel of the third image and of the fourth image.

8. A method as claimed in claim 1, comprising:
in said computer, determining the T1 time $T_{1,W}$ of water and the T1 time $T_{1,F}$ of fat based on the following equation for the water magnetization $M_W$ $$M_W = \frac{1-e^{\frac{-T_R}{T_{1,W}}}}{1-\cos(\alpha)e^{\frac{-T_R}{T_{1,W}}}}\sin(\alpha)\rho_W$$

and based on the following equation for the fat magnetization $M_F$ $$M_F = \frac{1-e^{\frac{-T_R}{T_{1,F}}}}{1-\cos(\alpha)e^{\frac{-T_R}{T_{1,F}}}}\sin(\alpha)\rho_F,$$

wherein $T_R$ is the time interval between two of the RF pulses (31) in chronological succession,
wherein $\rho_W$ is the water density in the voxel,
wherein $\rho_F$ is the fat density in the voxel, and
wherein α is the flip angle.

9. A method as claimed in claim 1, comprising:
in said computer, determining the water density and the fat density for the respective voxel depending on the first water magnetization of the respective voxel, the first fat magnetization of the respective voxel, the first flip angle, the second water magnetization of the respective voxel, the second fat magnetization of the respective voxel, and the second flip angle.

10. A method as claimed in claim 9, comprising
in said computer, determining the water proportion WA in the respective voxel by the following equation, depending on the water density $\rho_W$ and the fat density $\rho_F$ $$WA = \frac{\rho_W}{\rho_W + \rho_F}.$$

11. A method as claimed in claim 9, comprising:
in said computer, determining the fat proportion FA in the respective voxel by the following equation, depending on the water density $\rho_W$ and the fat density $\rho_F$ $$FA = \frac{\rho_F}{\rho_W + \rho_F}.$$

12. A method as claimed in claim 9, comprising
in said computer, determining the water proportion WA in the respective voxel by the following equation, depending on the water density $\rho_W$ and the fat density $\rho_F$ $$WA = \frac{\rho_W}{\rho_W + \rho_F};$$

and
in said computer, determining the fat proportion FA in the respective voxel by the following equation, depending on the water density $\rho_W$ and the fat density $\rho_F$ $$FA = \frac{\rho_F}{\rho_W + \rho_F}.$$

13. A method as claimed in claim 1, comprising:
operating said MR system with a measurement sequence configured to determine an actually achieved flip angle $\beta(x)$ for each voxel x based on RF excitation pulses set with a flip angle $\beta_{nom}$;
in said computer, calculating an actual flip angle $\alpha(x)$ in the respective voxel with the following equation $$\alpha(x) = \alpha_{nom} \frac{\beta(x)}{\beta_{nom}}$$

depending on the RF pulse with the flip angle $\alpha_{nom}$ that is respectively radiated to acquire the echoes; and
in said computer, using the actual flip angle to determine the T1 time of water and the T1 time of fat, instead of the first flip angle and second flip angle.

14. A magnetic resonance apparatus to determine the T1 time of water and the T1 time of fat in a predetermined volume segment of an examination subject, comprising:
a magnetic resonance (MR) data acquisition unit in which the examination subject is situated;
a control unit configured to operate the MR data acquisition unit to activate magnetic field gradients to generate gradient echoes at multiple echo times in the examination subject;
said control unit being configured to operate the magnetic system to acquire first echoes at at least two different echo times based on RF pulses with a first flip angle;
in a computer being configured to reconstructing an image of the volume segment comprising voxels, from said first echoes;
said computer being configured to determine a first water magnetization and a first fat magnetization for each voxel of the volume segment in the image reconstructed from the first echoes, depending on the first echoes according to the Dixon method;
said control unit being configured to operate the MR system to acquire second echoes at at least two different echo times based on RF pulses with a second flip angle;
said computer being configured to reconstruct an image of the volume segment, also comprising voxels, from said second echoes:
said computer being configured to determine a second water magnetization and a second fat magnetization for each voxel of the volume segment in the image reconstructed from the second echoes, depending on the second echoes according to the Dixon method;
said computer being configured to bring said image reconstructed from said first echoes and said image reconstructed from said second echoes into registration with each other in order to obtain a registered image also comprised of voxels, with each voxel in the registered image being a registration of a voxel of the image reconstructed from the first echoes and a corresponding voxel in the image reconstructed from the second echoes;
said computer being configured to determine the T1 time of water and the T1 time of fat for each voxel in the registered image, depending on the first water magnetization of the respective voxel in the registered image, the first fat magnetization of the respective voxel in the registered image, the first flip angle, the second water magnetization of the respective voxel in the registered image, the second fat magnetization of the respective voxel in the registered image, and the second flip angle, thereby obtaining a flip-angle dependent T1 time of water and a flip angle-dependent T1 time of fat; and
at a display screen in communication with said computer, presenting a visual designation of said flip angle-dependent T1 time of water and said flip angle-dependent T1 time of fat.

15. A non-transitory, computer-readable data storage medium encoded with programming instructions, said storage medium being loaded into a computerized control and evaluation system of a magnetic resonance apparatus in order to determine the T1 time of water and the T1 time of fat in a predetermined volume segment of an examination subject situated in the magnetic resonance apparatus, said programming instructions causing said computerized control and evaluation system to:
operate the MR system to activate magnetic field gradients to generate gradient echoes at multiple echo times in the examination subject;
operate the magnetic system to acquire first echoes at at least two different echo times based on RF pulses with a first flip angle;
reconstruct an image of the volume segment comprising voxels, from said first echoes;
determine a first water magnetization and a first fat magnetization for each voxel of the volume segment in the image reconstructed from the first echoes, depending on the first echoes according to the Dixon method;
operate the MR system to acquire second echoes at at least two different echo times based on RF pulses with a second flip angle;

reconstruct an image of the volume segment, also comprising voxels, from said second echoes;
determine a second water magnetization and a second fat magnetization for each voxel of the volume segment in the image reconstructed from the second echoes, depending on the second echoes according to the Dixon method;
bring said image reconstructed from said first echoes and said image reconstructed from said second echoes into registration with each other in order to obtain a registered image also comprised of voxels, with each voxel in the registered image being a registration of a voxel of the image reconstructed from the first echoes and a corresponding voxel in the image reconstructed from the second echoes;
determine the T1 time of water and the T1 time of fat for each voxel in the registered image, depending on the first water magnetization of the respective voxel in the registered image, the first fat magnetization of the respective voxel in the registered image, the first flip angle, the second water magnetization of the respective voxel in the registered image, the second fat magnetization of the respective voxel in the registered image, and the second flip angle, and thereby obtain a flip-angle dependent T1 time of water and a flip angle-dependent T1 time of fat; and
at a display screen in communication with said computer, present a visual designation of said flip angle-dependent T1 time of water and said flip angle-dependent T1 time of fat.

* * * * *